United States Patent [19]

Bonyhard

[11] Patent Number: 4,530,071

[45] Date of Patent: Jul. 16, 1985

[54] FAST ACCESS MAGNETIC BUBBLE MEMORY

[75] Inventor: Peter I. Bonyhard, New Providence, N.J.

[73] Assignee: AT&T Bell Laboratories, Murray Hill, N.J.

[21] Appl. No.: 550,229

[22] Filed: Nov. 10, 1983

[51] Int. Cl.³ .............................................. G11C 19/08
[52] U.S. Cl. .................................................... 365/15
[58] Field of Search ................................... 365/15, 16

[56] References Cited

PUBLICATIONS

IEEE Transactions on Magnetics–vol. Mag. 15, No. 6, Nov. 1979; pp. 1692–1696.

*Primary Examiner*—James W. Moffitt

*Attorney, Agent, or Firm*—Herbert M. Shapiro

[57] ABSTRACT

A magnetic bubble memory that can be read during every cycle of an in-plane drive field includes first and second minor loop sets into which alternate bits of a bubble pattern are stored. Two bubble generators are used to generate a sequence of bubbles in each of two associated lines for later movement to first and second write lines associated with the two minor loop sets, respectively. Swap functions are defined between each write line and the associated line and are operative in a push-pull manner to selectively move bubbles into alternative locations of each of the write lines. Later controlled movement of bubble patterns to selected locations in the minor loop sets results in permanent storage for later integration into a single read line for permitting "read-on-every-cycle" operation.

6 Claims, 9 Drawing Figures

FAST ACCESS MAGNETIC BUBBLE MEMORY

FIELD OF THE INVENTION

This invention relates to magnetic bubble memories and more particularly to such memories which are operative in the field access mode.

BACKGROUND OF THE INVENTION

A magnetic bubble memory operative in the field access mode was first disclosed in U.S. Pat. No. 3,534,347, of A. H. Bobeck, issued Oct. 13, 1970. Commercial memories of this type are organized in what is called a "major-minor" configuration as first disclosed in U.S. Pat. No. 3,618,054, of P. I. Bonyhard, U. F. Gianola, and A. J. Perneski, issued Nov. 2, 1971.

A bubble memory organized in the major-minor configuration comprises closed loop paths for recirculating patterns of magnetic bubbles. The paths are defined by magnetically soft elements (permalloy) or by patterns of ion implanted regions which move bubbles in response to a magnetic field reorienting (usually rotating) in the plane of bubble movement. The closed loops are called "minor loops" and are operative to move bubbles through reference positions at which bubble transfers to or from the loops occur.

Typically the minor loops are organized in parallel to move a pattern of bubbles into the reference positions during a read operation for transfer to a read out path as is well known. The read out path is called the "major" loop or path and extends between a bubble generator and, typically, an expander-detector arrangement of the type disclosed, for example, in U.S. Pat. No. 3,810,132 of A. H. Bobeck, issued May 7, 1974. In some organizations, the major path is separated into two paths, one called the "write line" originating at a bubble generator. The other is called the "read line" and terminates at a detector.

Frequently, a swap function is defined to permit transfer of bubble patterns between the reference positions in the minor loops and associated stages in the major path. In organizations where the major path is separated into two paths, the associated stages are defined in the write line. Such a swap function is disclosed in U.S. Pat. No. 4,007,453, of P. I. Bonyhard, Y. S. Chen and J. L. Smith, issued Feb. 8, 1977. The swap function results, for example, in a newly written bubble pattern in the associated stages being swapped for a bubble pattern occupying the reference positions in the minor loops when the swap occurs. But a problem exists in that minor loops cannot be located conveniently close enough to permit adjacent ones of the reference positions to coincide with consecutive stages of the write line. Consequently, swapping of information requires the placement of data in alternate stages, rather than in adjacent stages, of the write line. Consequently, read operations from the associated read line can occur only on every other cycle of the rotating in-plane field. This results in a reduction of the data rate of the bubble memory.

Various arrangements have been devised for permitting read-on-every-cycle operation. One such arrangement organizes the pattern of magnetic elements and electrical conductors such that bubbles can be located in stages between swap functions when a swap operation occurs and still do not interfere with the swap operation. We have found that we obtain better operating margins with our present design in which bubbles are stored only in alternative stages.

BRIEF DESCRIPTION OF AN ILLUSTRATIVE EMBODIMENT

The foregoing problem is overcome by employing first and second bubble generators operated electrically in series to generate bubbles (concurrently) into first and second auxiliary bubble propagation paths, respectively. First and second write lines are associated with the first and second auxiliary bubble propagation paths with first and second swap functions defined therebetween. The swap functions are operated electrically in series, but are placed and have geometries to move bubbles into the associated write lines during different phases of each rotating field cycle.

First and second sets of minor loops are associated with the first and second write lines (via swap functions) and first and second read lines are associated with the opposite ends of the minor loops of the first and second sets, respectively. The read lines are connected to a common path which, in turn, is connected to an expander-detector to interleave the bubble patterns from the two read lines in a manner to permit the desired read-on-every-cycle operation.

The arrangement avoids unwanted changes in data which can occur when bubbles are written into consecutive stages of a propagation path during a write operation also.

DETAILED DESCRIPTION

Figure 1:
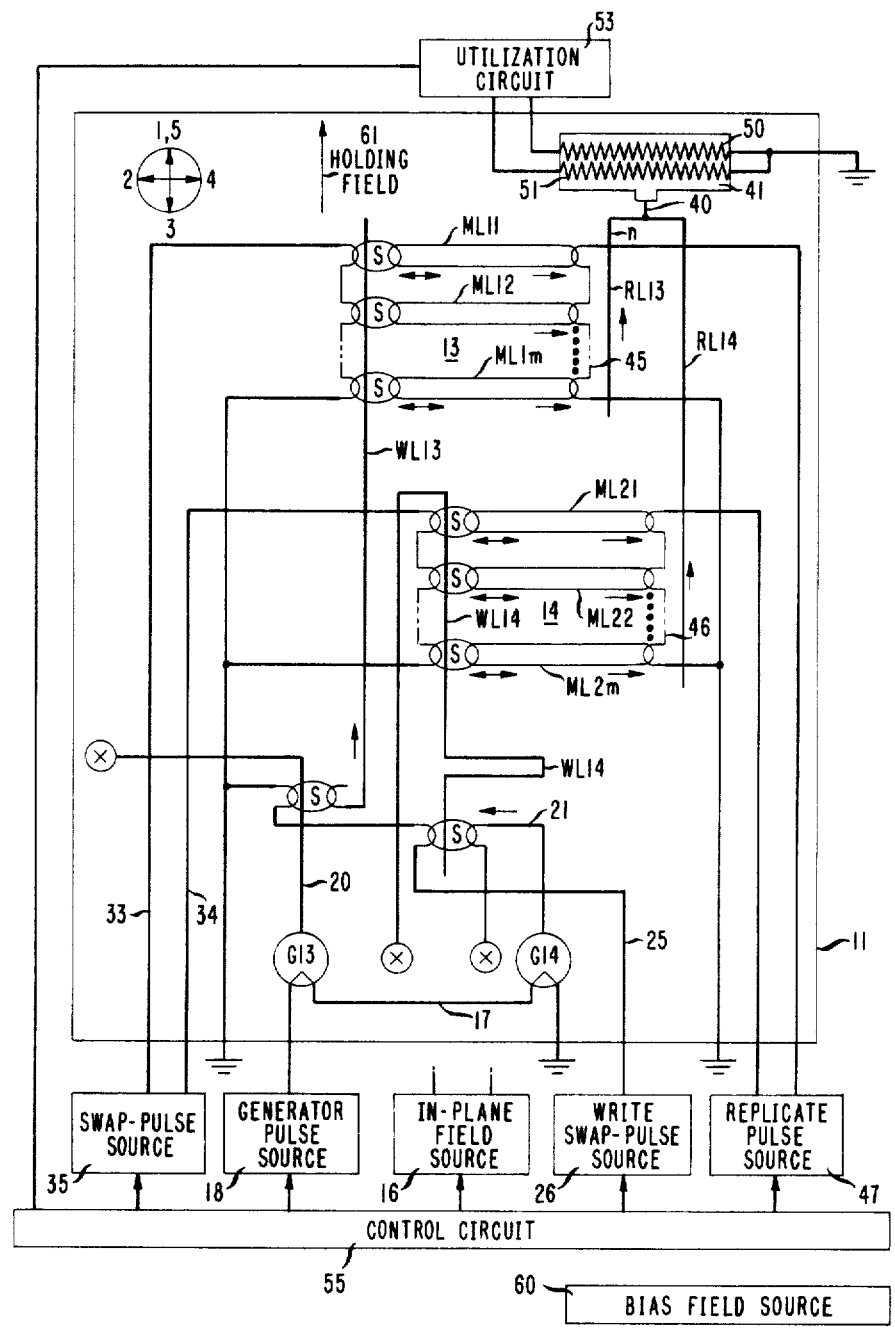
FIG. 1 is a schematic representation of a magnetic bubble memory in accordance with this invention.

FIG. 1 shows a magnetic bubble memory 10. The memory comprises a layer of material 11 in which magnetic bubbles can be moved. The memory is defined in the usual manner by patterns of magnetically soft elements, typically permalloy, formed on the surface of layer 11. The elements define bubble propagation paths represented as lines in FIG. 1.

The propagation paths are arranged in first and second sets 13 and 14. The loops are identified as $ML_{11}$, $ML_{12}$, ... $ML_{1n}$ and $ML_{21}$, $ML_{22}$, ... $ML_{2n}$ for loops 13 and 14, respectively. These loop sets constitute the minor loop field for the (field access) bubble memory shown.

Each of the minor loop sets 13 and 14 has associated with it a write line and a read line. The write and read lines of set 14 are designated WL14 and RL14, respectively. The write and read lines occupy positions shown illustratively at opposite ends of the minor loop sets. The flow of bubbles is indicated by the arrows to be from the minor loops into the read lines and back and forth between the minor loops and the write lines. Bubbles move in the read and write lines only in the directions shown by the arrows. Each write line originates at a bubble generator, G13 and G14, for sets 13 and 14, respectively. Bubble movement, of course, is responsive to a magnetic field reorienting (typically by rotation) in the plane of bubble movement. Such a field is provided in the usual manner by an in-plane field source represented by block 16.

Generators G13 and G14 are coupled, electrically in series, by conductor 17. Conductor 17 is connected between a generator pulse source, represented by block 18, and a reference potential represented as ground. Source 18 pulses the generators during each cycle of the in-plane field thus filling associated lines 20 and 21, respectively, with bubbles. It will be appreciated that a single source 18 can drive any number of chips 11 by connecting the conductors 17 electrically in series on all the chips. Also, in the operation to be described here, pulsing by source 18 on every other cycle only, thus filling only alternate stages of the associated lines is sufficient. As the in-plane field rotates, the bubbles are extinguished at the end of the associated lines by annihilators represented by an X in each instance.

A bubble pattern representative of data is formed in the write lines during a write operation which selectively moves bubbles from the associated lines to the corresponding write lines. This movement is achieved in a unique manner which moves a bubble into write line WL13 during a first phase of a write pulse and into WL14 on a second phase. In the illustrative embodiment, a swap function(s) is implemented between each associated line and the corresponding write line; but the swap is really operative as a unidirectional transfer function because the write line is unoccupied when a swap occurs. A conductor 25 is connected between a write swap pulse source, represented by block 26, and ground for producing the (write) swap operation when pulsed. It is this relationship between the lines and the timing in which the (write) swap pulses are applied which provides a unique operation which appropriately transfers bubbles selectively into corresponding write lines during different phases of a swap pulse. The swap operations activated via conductor 25 are designated "write" swap operations to distinguish from other swap operations occurring to move data to minor loops as will become clear.

Figure 2:
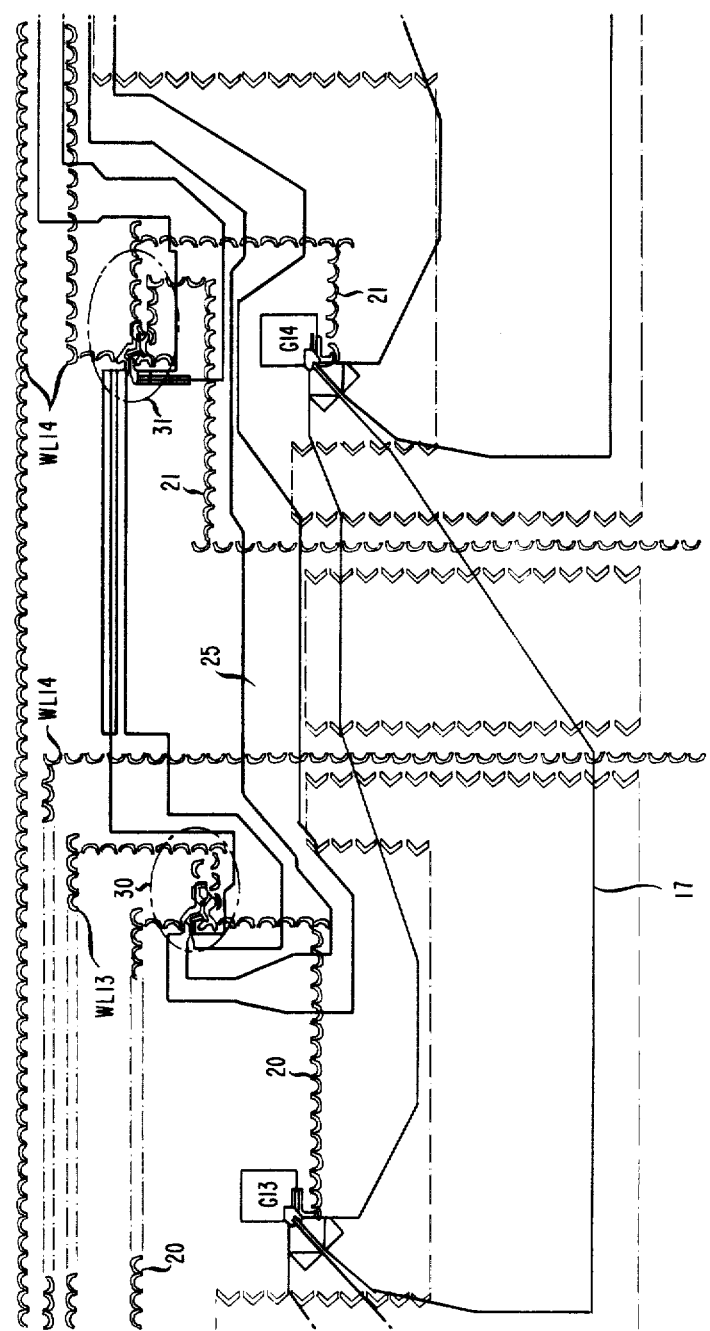
FIGS. 2, 3, 4, 6, 7, 8 and 9 are enlarged top views of portions of the memory of FIG. 1.
Figure 3:
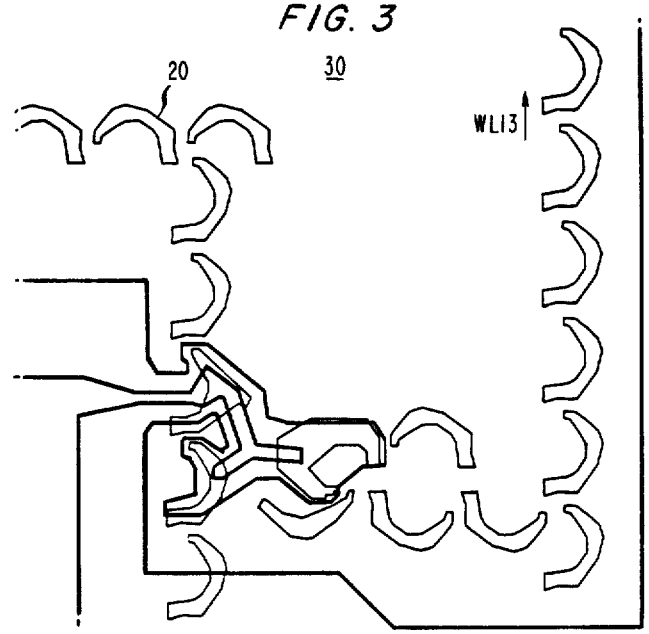
Figure 4:
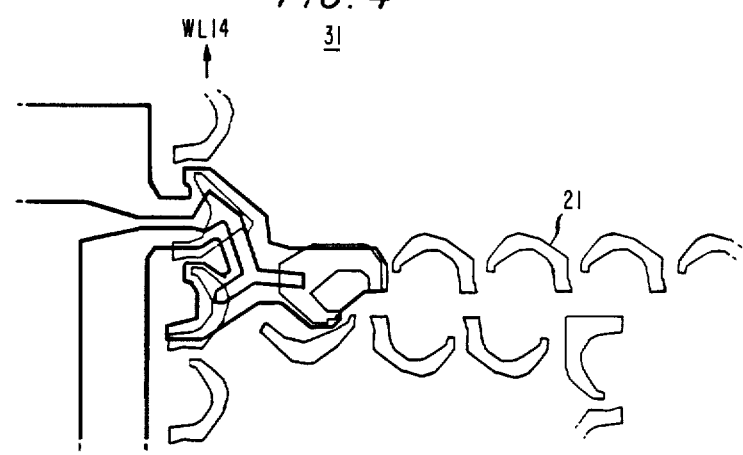

FIG. 2 shows enlarged the patterns of permalloy elements and electrical conductors which define the various lines for implementing a write operation. FIGS. 3 and 4 show enlargements of the areas of the swap functions in FIG. 2 encompassed by enclosures 30 and 31, respectively. We will now discuss the write operation showing the movement of bubbles in the areas of the swap functions at 30 and 31. The operation is synchronized to the in-plane field (H) orientation as represented in FIG. 1 by the encircled double-headed arrows. Operation commences with bubbles occupying alternate locations in associated lines 20 and 21 in the illustrative embodiment, as shown in FIGS. 3 and 4. Consequently, whenever conductor 25 is pulsed, bubble movement occurs in both of the swap areas. It is that movement of bubbles in different phases of the pulse on conductor 25 with respect to the in-plane field which provides the requisite push-pull operation.

Figure 5:
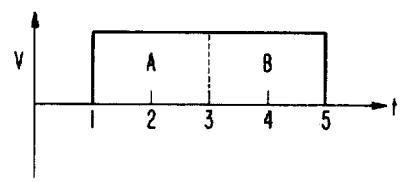
FIG. 5 is a pulse diagram of swap pulses applied during a write operation of the memory of FIG. 1.

We will adopt the convention that the letters AB represent first and second portions of a pulse on conductor 25 as shown in FIG. 5. The information alternatives which can be represented are shown in the following table:

| Data-AB | Pulse Form |
| --- | --- |
| 00 | |
| 01 |  |
| 10 |  |
| 11 | 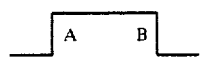 |
| (or) 11 |  |

Figure 6:
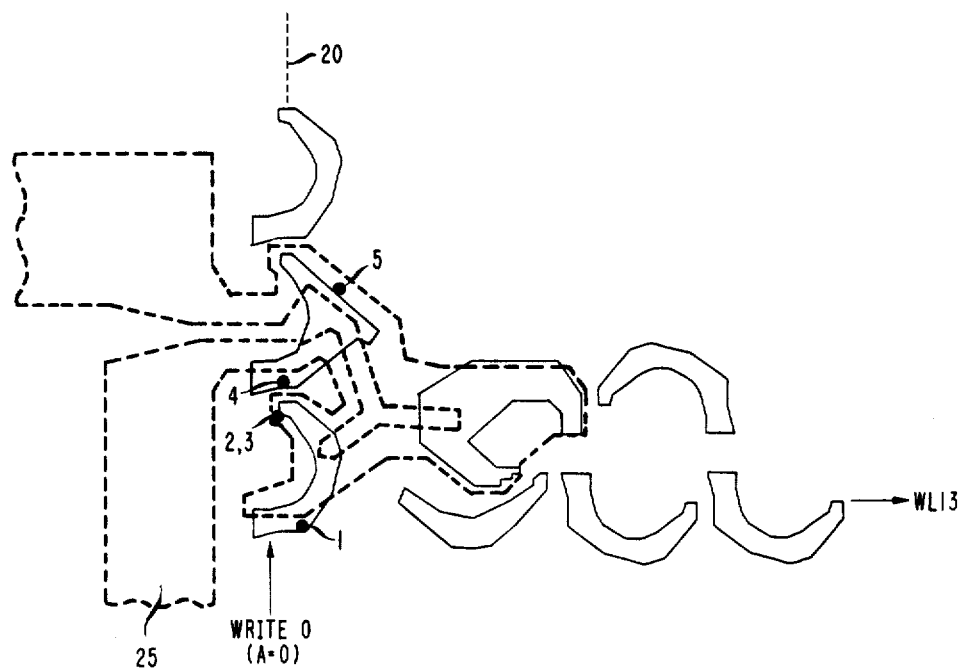
Figure 7:
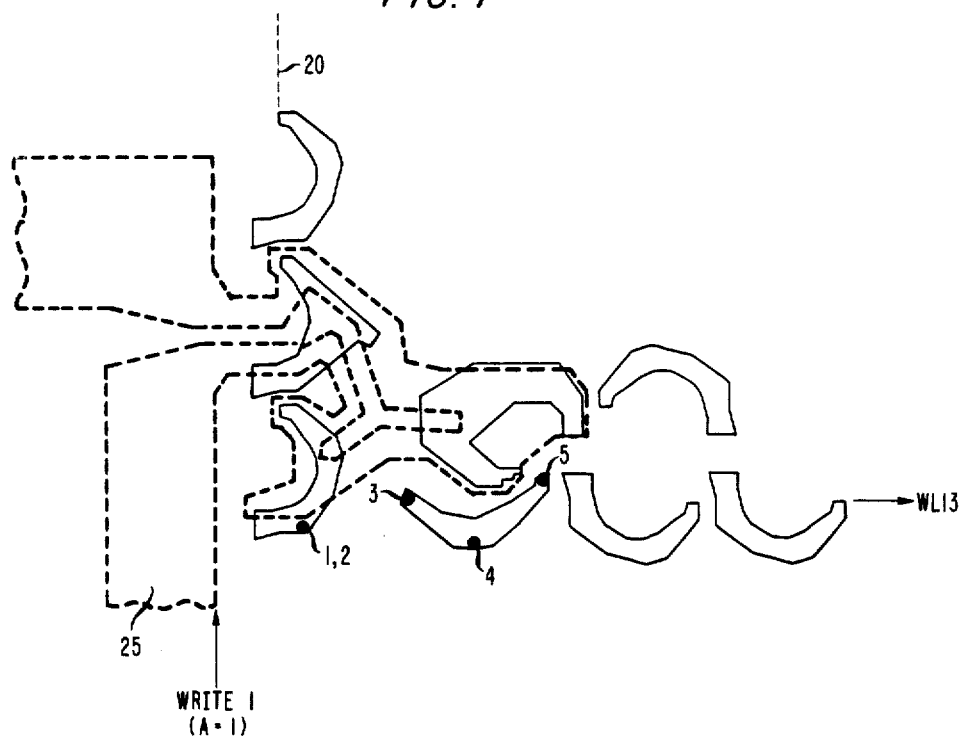
Figure 8:
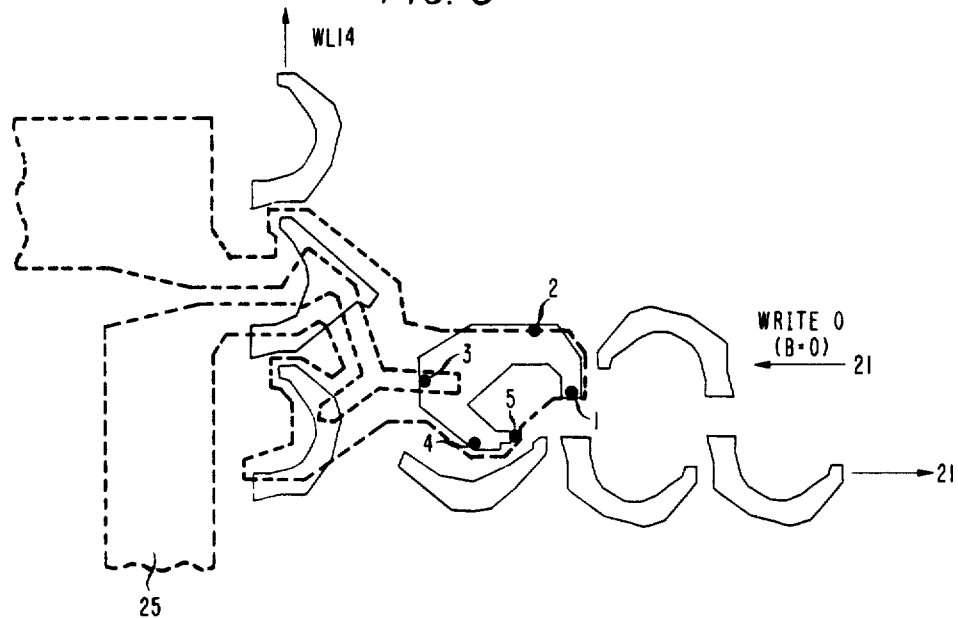
Figure 9:
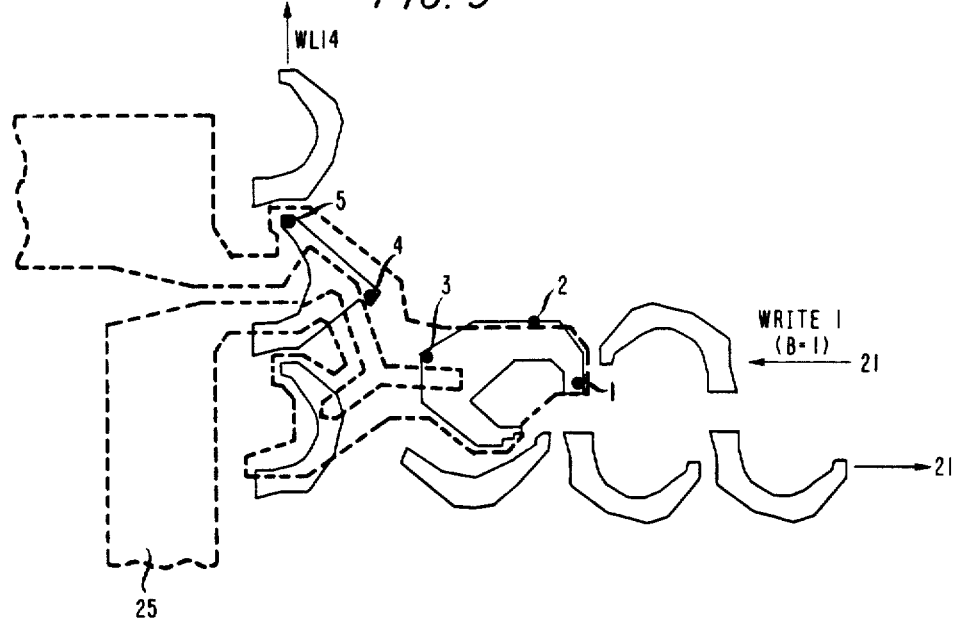

A comparison of FIGS. 6 and 8 reveals that the input to the swap is different in the two instances. Yet the permalloy and the conductor geometries in the two figures are the same. Note, however, that associated lines 20 and 21 in FIGS. 6 and 8, respectively, are located differently and thus introduce input bubbles to the swap in a different manner. Consequently, these input bubbles respond to swap pulses 90 degrees out of phase. The fact that the input to the swap is different permits a swap pulse (A) one-half the full duration as described in the above-mentioned U.S. Pat. No. 4,007,453 to affect a first swap but not a second electrically in series with it. The arrangement also permits a swap pulse (B) also half the normal duration to affect only the second swap but not the first. Note that FIGS. 6 and 8 depict write zero operations whereas FIGS. 7 and 9 depict write one operations. The dots in FIGS. 6-9 represent consecutive positions for a magnetic bubble with the numerals being consistent with the rotating field orientations as incidated by the encircled double-headed arrows in FIG. 1.

The data streams formed during the write operation move along write lines WL13 and WL14 in response to continuing rotations of the in-pulse field in a manner well understood in the art. When the data streams occupy stages properly placed for swapping into selected locations of the minor loops, swap conductors 33 and 34 of FIG. 1 are pulsed by a swap pulse source represented by block 35 for moving the appropriate data into the associated minor loop sets. The data streams are now stored in the minor loops. By the correct adjustment of the number of bit locations in write lines WL13 and WL14, swapping into the minor loops can occur concurrently in minor loops 13 and 14 and, correspondingly, the data block will occupy corresponding positions in minor loops 13 and 14 as is well known in the art.

The locations at which the various minor loops most closely approach the write lines define areas in which swap functions are implemented. The swap functions are represented in FIG. 1 by encircled S designations. Each such representation includes permalloy and conductor geometries as shown in FIG. 3 or FIG. 4. The swap functions of a set are connected electrically in series and are operative when activated to swap data between the minor loops and the associated stages of the corresponding write line in parallel.

The result of such an arrangement permits the simple implementation of a push-pull arrangement for storing alternate bits in first and second coordinated minor loop sets. The numbers of loops in each set of minor loops and the number of bits in each loop of each set are chosen to permit the stored data to be reorganized during a read operation into a continuous sequence of bits identical to the bits originally stored. The synchronization, of course, is provided by the rotating in-plane field. In one illustrative embodiment of a (nominally) one million bit bubble memory, set 13 includes loops 1, 3, 5, . . . 327 and set 14 includes loops 2, 4, 6, . . . 328. There are 4,000 (binary 4,096) positions per loop.

The two data streams are reintegrated during a read operation by the physical joining of the two read lines into a common path. The two read lines RL13 and RL14 are shown entering the common path, designated 40 in FIG. 1, for movement into an expander-detector arrangement 41. Read arrangements of this type are described in the AIP conference proceedings, "64K Fast Access Chip Design", No. 29, Dec. 9–12, 1975, pp. 51–53.

Information is moved into the read lines by replication of bubble patterns moved in the minor loops to positions which closely approach associated stages in the associated read lines. Those stages are coupled by replicate conductors 45 and 46 for loop sets 13 and 14, respectively. Conductors 45 and 46 are shown connected between a replicate pulse source 47 and ground. During a selected cycle of the in-plane field, the replicate pulse source pulses conductors 45 and 46 causing a selected bubble pattern to move into the associated read line. Remember—"adjacent" data representations (bubble-no bubble) are stored in alternative bit locations at this time. The patterns move along the read line to be interleaved at 40 into a pattern where those adjacent bits are stored in adjacent stages for movement to the expander-detector.

An expander detector includes a magneto-resistive element 50 and a dummy detector 51 arranged in a bridge in a manner well known in the art. The detectors are usually connected between a utilization circuit 53 and ground. Sources 16, 18, 26, 35 and 47 and utilization circuit 53 are controlled by a control circuit represented by block 55.

Bubble memories operate in the presence of a magnetic bias field. Such a bias field is directed antiparallel to the magnetization of a bubble and is supplied by a permanent magnet represented by block 60. An in-plane holding field often is present also. Such a field is respresented in FIG. 1 by arrow 61 indicating the direction of such a field in the arrangement depicted there.

What has been described is merely illustrative of the principles of this invention. Various modifications of this invention may be devised by one skilled in the art in accordance with those principles within the spirit and scope of this invention as encompassed by the following claims.

What is claimed is:

1. A magnetic bubble memory comprising a layer of material in which magnetic bubbles can be moved, means for defining first and second sets of minor loops in said layer, means for defining first and second write lines and first and second read lines coupled to said first and second sets of minor loops, respectively, means for generating bubbles in first and second associated lines, means for generating a cyclical magnetic field for moving said bubbles in said lines and loops synchronously, first and second swap means for moving bubbles selectively from said first and second associated lines to said first and second write lines, respectively, during first and second phases of a cycle of said magnetic field.

2. A magnetic bubble memory in accordance with claim 1 wherein said swap means includes first and second patterns of magnetic areas, respectively, and an electrical conductor coupling said layer at said first and second patterns electrically in series.

3. A magnetic bubble memory in accordance with claim 2 wherein said first and second patterns comprise permalloy.

4. A magnetic bubble memory in accordance with claim 3 wherein said first and second read lines converge to form a single path to a bubble detector arrangement and means for moving bubble patterns from a selected location in said first and second sets to said first and second read lines, respectively.

5. A magnetic bubble memory in accordance with claim 4 wherein said means for generating comprises first and second generators and a single electrical conductor coupling the two generators electrically in series.

6. A magnetic bubble memory in accordance with claim 5 wherein said first and second associated lines are operative responsive to a reorienting in-plane field to move bubbles into a swap function from different directions.

* * * * *